(12) United States Patent
Pai et al.

(10) Patent No.: US 10,860,133 B1
(45) Date of Patent: Dec. 8, 2020

(54) THREE-DIMENSIONAL TOUCH KNOB

(71) Applicants: Chih-Chiang Pai, Taoyuan (TW);
Meng-Kuei Lin, Taoyuan (TW);
Hung-Chi Huang, Taoyuan (TW)

(72) Inventors: Chih-Chiang Pai, Taoyuan (TW);
Meng-Kuei Lin, Taoyuan (TW);
Hung-Chi Huang, Taoyuan (TW)

(73) Assignee: YOUNG FAST OPTOELECTRONICS CO., LTD., Taoyuan (TW)

( * ) Notice: Subject to any disclaimer, the term of this patent is extended or adjusted under 35 U.S.C. 154(b) by 0 days.

(21) Appl. No.: 16/698,777

(22) Filed: Nov. 27, 2019

(51) Int. Cl.
*G06F 3/041* (2006.01)

(52) U.S. Cl.
CPC .................. *G06F 3/0416* (2013.01)

(58) Field of Classification Search
CPC ........ G06F 1/1692; G06F 3/016; G06F 3/044; G06F 1/1662; G06F 1/1613; G06F 3/03547; G06F 3/041; G06F 3/0414; G06F 3/0227; G06F 3/0416; G06F 2203/04103; G06F 2203/04105; G06F 2203/04104; G09G 5/006
See application file for complete search history.

(56) References Cited

U.S. PATENT DOCUMENTS

| 9,535,557 | B2* | 1/2017 | Bernstein | G06F 1/1692 |
|---|---|---|---|---|
| 2008/0055265 | A1* | 3/2008 | Bewley | G06F 3/04886 345/173 |
| 2008/0138589 | A1* | 6/2008 | Wakabayashi | H01H 13/83 428/195.1 |
| 2011/0102325 | A1* | 5/2011 | Sato | G06F 3/045 345/168 |
| 2012/0038587 | A1* | 2/2012 | Alford | B64D 11/0606 345/174 |
| 2013/0314322 | A1* | 11/2013 | Liu | G06F 3/04883 345/168 |
| 2014/0253487 | A1* | 9/2014 | Bezinge | G04G 19/12 345/173 |
| 2016/0170250 | A1* | 6/2016 | Ghali | G06F 1/1643 359/296 |
| 2016/0253029 | A1* | 9/2016 | Maeda | H03K 17/9622 345/174 |
| 2017/0017324 | A1* | 1/2017 | O'Keeffe | G06F 3/0416 |
| 2017/0115804 | A1* | 4/2017 | Oikubo | H01L 27/323 |
| 2019/0073003 | A1* | 3/2019 | Xu | G06F 3/04886 |
| 2019/0272053 | A1* | 9/2019 | Ballan | G06F 3/044 |
| 2019/0384431 | A1* | 12/2019 | Berger | G06F 3/04883 |
| 2020/0073513 | A1* | 3/2020 | Ballan | G06F 3/044 |

\* cited by examiner

*Primary Examiner* — Vinh T Lam

(57) ABSTRACT

A touch knob includes a knob shell having a three-dimensional contour with a curved joint surface; an ITO touch sensor disposed on the knob shell; an auxiliary conductive unit with extensibility, connected on the touch sensor to form an overlapping area covering the joint surface, and the auxiliary conductive unit in the overlapping area having a conductive pattern corresponding to the touch sensor; and a surface coating layer having a three-dimensional contour corresponding to the knob shell and attached on both the touch sensor and the auxiliary conductive unit. An opaque mask surface is provided on an inner side of the surface coating layer. The mask surface cloaks the overlapping area.

10 Claims, 6 Drawing Sheets

THREE-DIMENSIONAL TOUCH KNOB

TECHNICAL FIELD

The invention relates to touch knobs, particularly to a three-dimensional touch knob with a touch sensor made of a metal oxide material.

RELATED ART

Touch knobs have been widely applied in car dashboards, household appliances and electronic devices as control knobs. A current method for manufacturing a touch knob primarily adopts extensible transparent conductive film material (such as carbon nanometer tube transparent conductive film) to make a touch sensor. After the extensible transparent conductive film has been printed with a metal circuit, the planar touch sensor is processed with thermoforming by the in mold decoration to form a three-dimensional touch sensor. This product can be directly used or further processed for reinforcement depending on demands. Such a conventional method considerably relies upon extensibility of material of the transparent conductive film. In comparison with normally used transparent metal oxide film, however, the extensible transparent conductive film not only is more expensive but also has less sources of material supply. This forms multiple limits. In addition, currently, the mass production of the extensible transparent conductive film is still too unstable to satisfy market demand. Although the transparent conductive metal oxide film (such as ITO) is cheap and has plentiful sources of material supply, its fragility and poor extensibility tends to be broken at bent portions to cause electric discontinuity (interruption of signal transmission). As a result, it cannot be applied in three-dimensional touch knobs so far.

SUMMARY OF THE INVENTION

An object of the invention is to provide an improved three-dimensional touch knob, which can reduce material costs and increase the yield rate of products.

To accomplish the above object, the invention is to provide a three-dimensional touch knob, which includes: a knob shell, having a three-dimensional contour with a first surface, a second surface and a joint surface, wherein the first surface is located at an outer surface of a top of the knob shell, the second surface is located an outer surface of a lateral periphery of the knob shell, and the joint surface connects between the first surface and the second surface; a touch sensor, formed by a transparent conductive metal oxide film, having a touch sensing area on the first surface, the joint surface and at least part of the second surface; an auxiliary conductive unit, made of a material with extensibility and low impedance, electrically connected on the touch sensor to form an overlapping area covering the joint surface and at least part of the second surface, wherein the auxiliary conductive unit in the overlapping area has a conductive pattern corresponding to the touch sensor; and a surface coating layer, made of an insulative transparent material, having a three-dimensional contour corresponding to the knob shell, and attached on both the touch sensor and the auxiliary conductive unit, wherein an opaque mask surface is provided on an inner side of the surface coating layer, and the mask surface cloaks at least the overlapping area.

In a preferred embodiment, the joint surface is a curved surface, a spherical curved or an obtuse surface.

In a preferred embodiment, the touch sensor is a capacitive touch sensor, an electromagnetic touch sensor, an acoustic touch sensor, a vibrating touch sensor touch sensor or an optical touch sensor.

In a preferred embodiment, the touch sensor is made of indium tin oxide, indium zinc oxide, zinc aluminum oxide or antimony tin oxide.

In a preferred embodiment, the auxiliary conductive unit is made of conductive silver paste or a metal film whose primary component is one of gold, silver, copper, aluminum, molybdenum and nickel.

In a preferred embodiment, the mask surface is formed by insulative ink or photoresist.

In a preferred embodiment, the mask surface is provided with a decorative pattern, an icon or a symbol.

In a preferred embodiment, the knob shell is made of glass, polymethyl methacrylate, polystyrene, polycarbonate or polypropylene.

In a preferred embodiment, the first surface of the knob shell is a transparent area, and the first surface, the touch sensor and the surface coating layer jointly form a transparent window.

In a preferred embodiment, a chamber in the knob shell is provided with a liquid crystal display (LCD) or a light emitting diodes (LED).

DETAILED DESCRIPTION OF THE INVENTION

Please refer to FIGS. 1-5. A preferred embodiment of the three-dimensional touch knob includes a knob shell 10, a touch sensor 20, an auxiliary conductive unit 30 and a surface coating layer 40.

Figure 1:
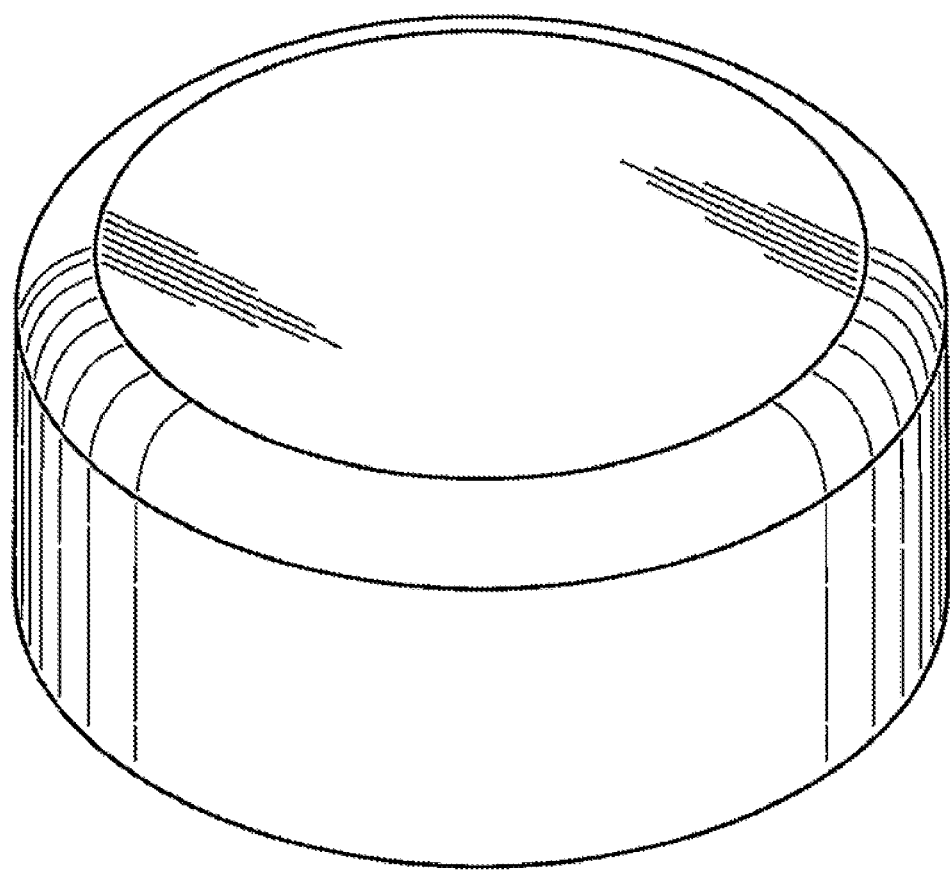
FIG. 1 is a perspective view of the invention.
Figure 2:
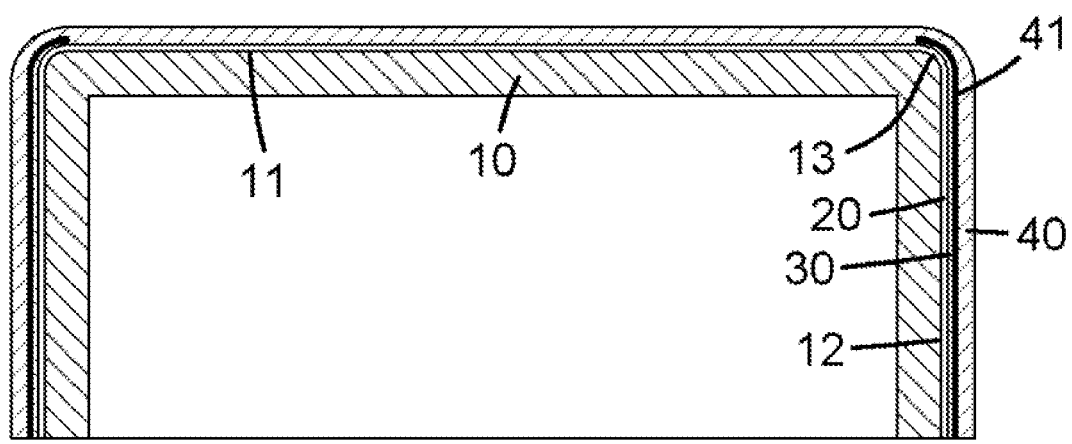
FIG. 2 is a cross-section view of the invention.

As shown in FIGS. 1 and 2, the knob shell 10 is made of an insulative material and has a three-dimensional contour with a first surface 11, a second surface 12 and a joint surface 13. The first surface 11 is located at an outer surface of a top of the knob shell 10. The second surface 12 is located an outer surface of a lateral periphery of the knob shell 10. The joint surface 13 connects between the first surface 11 and the second surface 12. Preferably, the joint surface 13 is a surface without a sharp-angled bend, for example, a curved surface.

Figure 3:
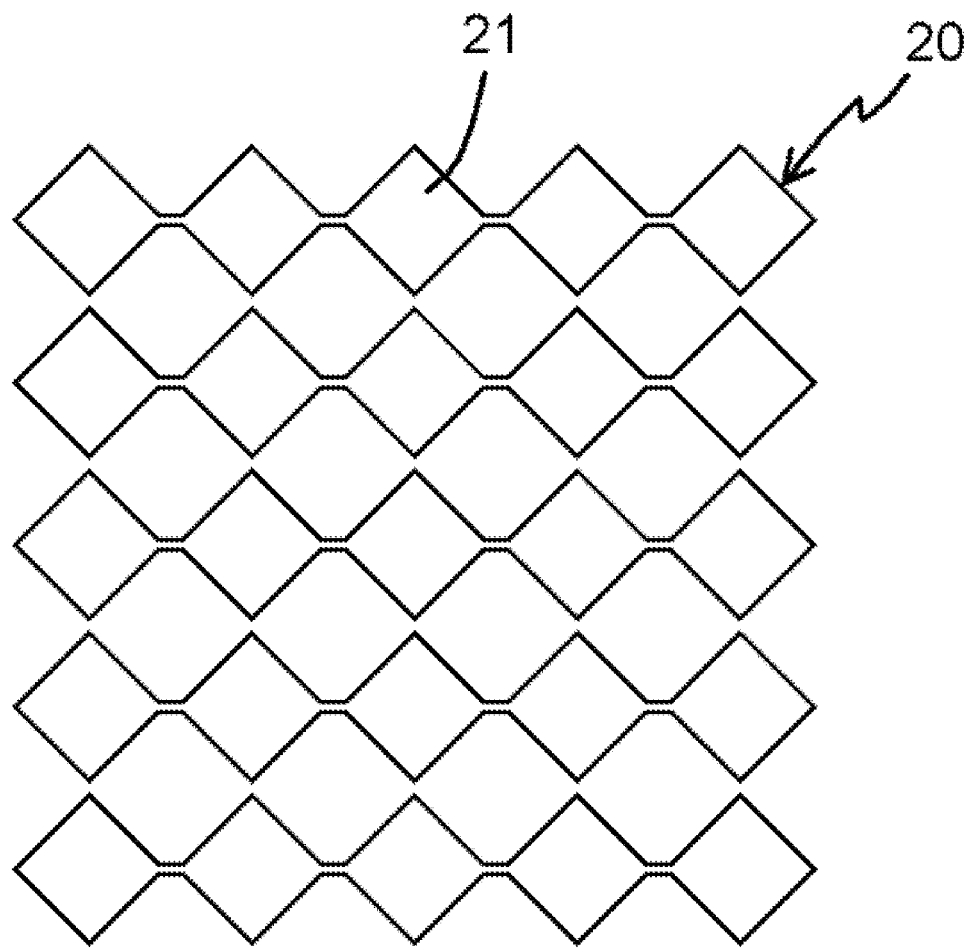
FIG. 3 is a planar schematic view of the touch sensor of the invention.
Figure 4:
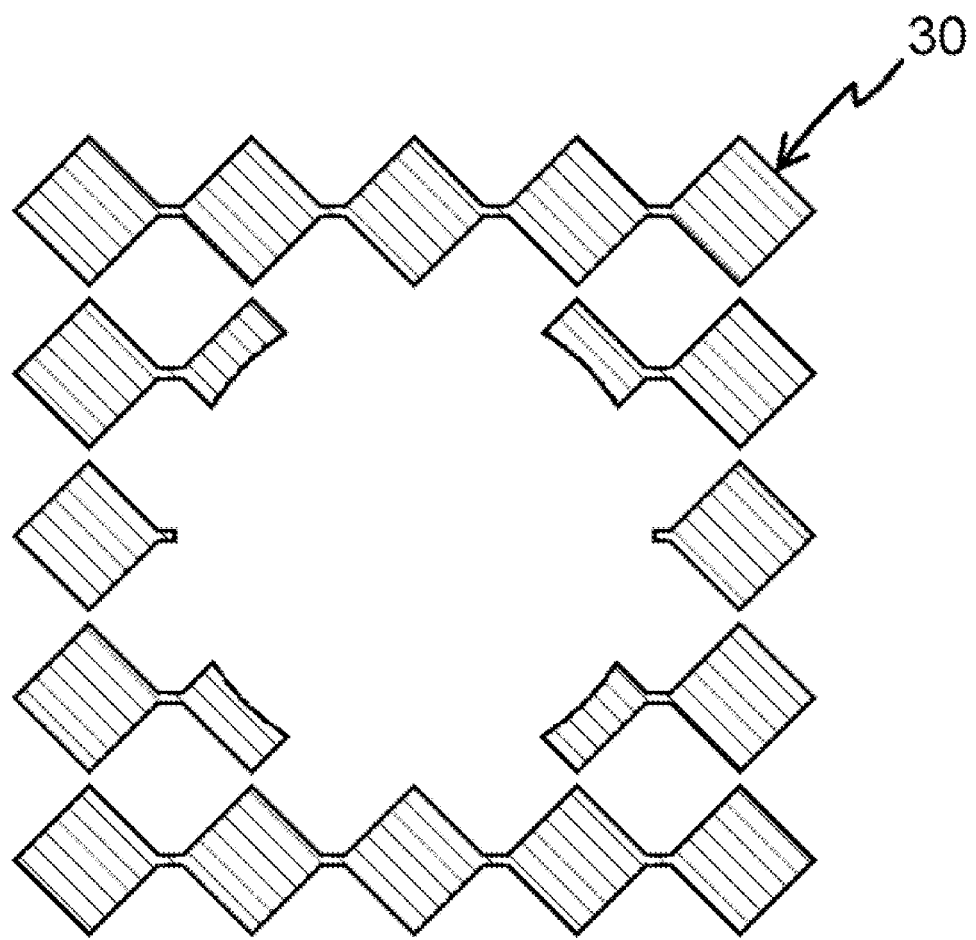
FIG. 4 is a planar schematic view of the auxiliary conductive unit of the invention.
Figure 5:
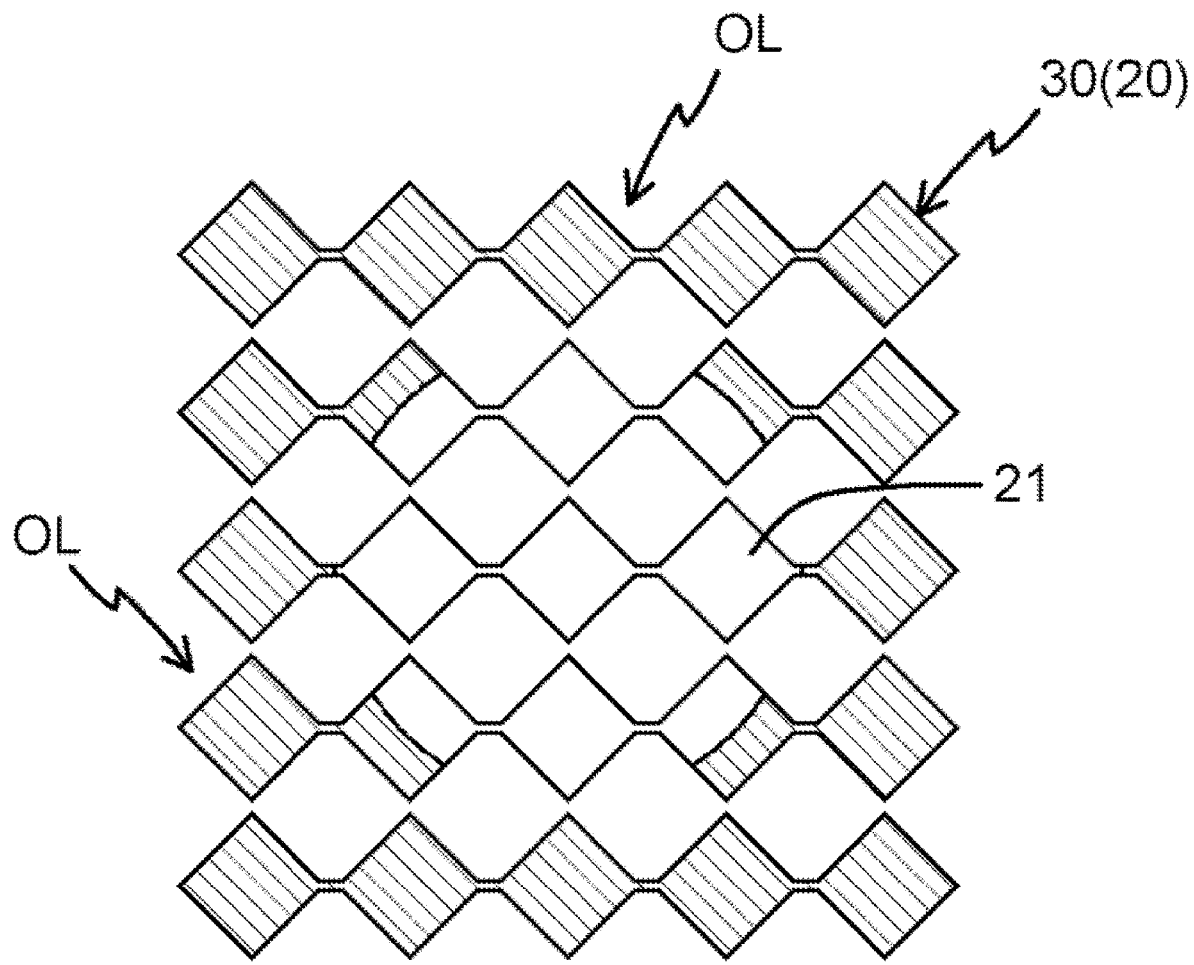
FIG. 5 is a planar schematic view of the auxiliary conductive unit overlapping the touch sensor of the invention.

As shown in FIGS. 2-5, the touch sensor 20 is a transparent touch sensor made of an indium tin oxide (ITO) film. In this embodiment, the touch sensor 20 is capacitive touch sensor. Because a structure of the capacitive touch sensor has been well-known, it will not be described here. FIGS. 3 and 5 only briefly depict a pattern of sensing electrodes 21 in a touch sensing area. All remaining components (such as signal wires, etc.) are omitted. The touch sensing area is arranged on the first surface 11, the joint surface 13 and at least part of the second surface 12.

The auxiliary conductive unit 30 is made of a material with extensibility and low impedance, such as copper foil or silver paste. As shown in FIGS. 2, 4 and 5, the auxiliary conductive unit 30 is electrically connected on the touch sensor 20 to form an overlapping area OL. The overlapping area OL includes ranges of both the joint surface 13 and at least part of the second surface 12. The auxiliary conductive unit 30 in the overlapping area OL has a conductive pattern corresponding to the touch sensor 20.

As shown in FIGS. 1 and 2, the surface coating layer 40 is made of an insulative transparent material, such as polymethyl methacrylate (PMMA), polystyrene (PS), polycarbonate (PC), polypropylene (PP), etc., and has a three-dimensional contour corresponding to the knob shell 10. The surface coating layer 40 is tightly attached on both the touch sensor 20 and the auxiliary conductive unit 30. An opaque mask surface 41, which is formed by insulative ink or photoresist, is provided on an inner side of the surface coating layer 40. The mask surface 41 cloaks at least the overlapping area OL. Preferably, both the joint surface 13 and the second surface 12 are completely cloaked. The mask surface 41 may be optionally provided with various decorative designs such as decorative patterns, icons or symbols. The mask surface 41 cloaks those visible circuit patterns such as the auxiliary conductive unit 30 in the overlapping area OL, so appearance or function indication can be improved.

As known by the public, ITO material has fragility and poor extensibility, so an ITO conductive film is easy to be broken at a bent or stretched portion to cause conductive interruption or poor conductivity. In this embodiment, when the touch sensor 20 made of ITO material is disposed on the first surface 11, the joint surface 13 and the second surface 21, portions of the ITO conductive film on the joint surface 13 and the second surface 12 are bent or stretched, so poor conductivity may occur at these portions. Accordingly, the invention disposes the auxiliary conductive unit 30 on the joint surface 13 and the second surface 12 to overcome this problem. The auxiliary conductive unit 30 is made of material with low impedance and great extensity such as copper foil or silver paste, so rupture or conductive interruption will not occur at the bent or stretched portion. The auxiliary conductive unit 30 being disposed on the touch sensor 20 can auxiliarily keep conductivity of the touch sensor 20 at the bent or stretched portions to guarantee normal operation of the touch sensor 20.

The knob shell 10 is used to be a control board of an electronic or electrical device and is integratedly assembled with the control board (not shown). When using, the touch knob cannot be rotated (because it is fixed to the control board), but a sliding rotation on an outer surface of the touch knob by a user's finger can input a touch signal to the touch sensor 20. The touch signal is converted into a control signal by a signal processor to control the electronic or electrical device. In addition, the first surface 11 of the touch knob is a flat touch panel, so a user may also input various data or commands through the touch panel, such as a click, a gesture or handwriting input.

Figure 6:
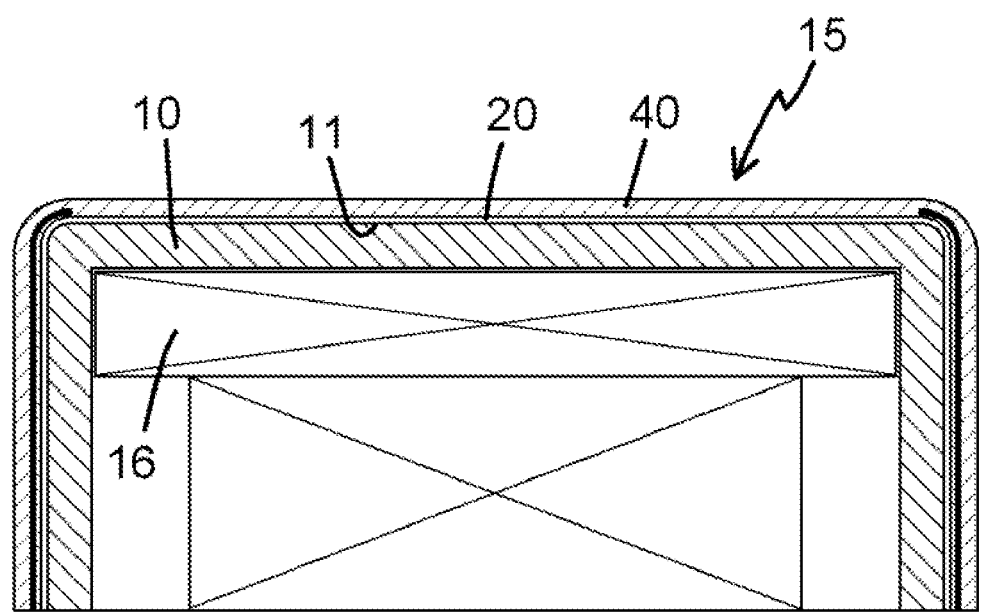
FIG. 6 is a cross-section view of another embodiment of the invention.

Please refer to FIG. 6, which shows another embodiment of the invention. In this embodiment, the knob shell 10 is made of insulative material with high transmittance, such as glass, polymethyl methacrylate (PMMA), polystyrene (PS), polycarbonate (PC) or polypropylene (PP). As a result, a transparent area is formed in the first surface 11 of the knob shell 10. Also, both the touch sensor 11 and the surface coating layer 40 on the first surface 11 are transparent thin layers. Thus, a transparent window 15 is formed in the range of the first surface 11. Thereby, a chamber in the knob shell 10 can be provided with an information display 16 such as a liquid crystal display (LCD) or light emitting diodes (LEDs) for reflecting information of operation of the knob through the transparent window 15.

It will be appreciated by persons skilled in the art that the above embodiments have been described by way of example only and not in any limitative sense, and that various alterations and modifications are possible without departure from the scope of the invention as defined by the appended claims.

What is claimed is:

1. A three-dimensional touch knob comprising:
   a knob shell, made of an insulative material, having a three-dimensional contour with a first surface, a second surface and a joint surface, wherein the first surface is located at an outer surface of a top of the knob shell, the second surface is located an outer surface of a lateral periphery of the knob shell, and the joint surface connects between the first surface and the second surface;
   a touch sensor, formed by a conductive metal oxide film, having a touch sensing area on the first surface, the joint surface and at least part of the second surface;
   an auxiliary conductive unit, electrically connected on the touch sensor to form an overlapping area covering the joint surface and at least part of the second surface, wherein the auxiliary conductive unit in the overlapping area has a conductive pattern corresponding to the touch sensor; and
   a surface coating layer, made of an insulative transparent material, having a three-dimensional contour corresponding to the knob shell, and attached on both the touch sensor and the auxiliary conductive unit, wherein an opaque mask surface is provided on an inner side of the surface coating layer, and the mask surface cloaks at least the overlapping area.

2. The three-dimensional touch knob of claim 1, wherein the joint surface is a curved surface, a spherical curved or an obtuse surface.

3. The three-dimensional touch knob of claim 1, wherein the touch sensor is a capacitive touch sensor, an electromagnetic touch sensor, an acoustic touch sensor, a vibrating touch sensor touch sensor or an optical touch sensor.

4. The three-dimensional touch knob of claim 1, wherein the touch sensor is made of indium tin oxide, indium zinc oxide, zinc aluminum oxide or antimony tin oxide.

5. The three-dimensional touch knob of claim 1, wherein the auxiliary conductive unit is made of conductive silver paste or a metal film whose primary component is one of gold, silver, copper, aluminum, molybdenum and nickel.

6. The three-dimensional touch knob of claim 1, wherein the mask surface is formed by insulative ink or photoresist.

7. The three-dimensional touch knob of claim 6, wherein the mask surface is provided with a decorative pattern, an icon or a symbol.

8. The three-dimensional touch knob of claim 1, wherein the knob shell is made of glass, polymethyl methacrylate, polystyrene, polycarbonate or polypropylene.

9. The three-dimensional touch knob of claim 8, wherein the first surface of the knob shell is a transparent area, and the first surface, the touch sensor and the surface coating layer jointly form a transparent window.

10. The three-dimensional touch knob of claim 9, wherein a chamber in the knob shell is provided with a liquid crystal display (LCD) or a light emitting diodes (LED).

\* \* \* \* \*